United States Patent
Choi et al.

(10) Patent No.: US 10,153,397 B2
(45) Date of Patent: Dec. 11, 2018

(54) SEMICONDUCTOR LIGHT-EMITTING DEVICE

(71) Applicant: Samsung Electronics Co., Ltd., Suwon-si, Gyeonggi-do (KR)

(72) Inventors: Yong-seok Choi, Suwon-si (KR); Min-ho Kim, Hwaseong-si (KR); Jeong-wook Lee, Yongin-si (KR); Jai-won Jean, Seoul (KR); Chul-min Kim, Gunpo-si (KR); Jae-deok Jeong, Suwon-si (KR); Min-hwan Kim, Ansan-si (KR); Jang-mi Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/689,220

(22) Filed: Aug. 29, 2017

(65) Prior Publication Data

US 2018/0190863 A1    Jul. 5, 2018

(30) Foreign Application Priority Data

Jan. 5, 2017    (KR) .......................... 10-2017-0002064

(51) Int. Cl.
| | | |
|---|---|---|
| H01L 33/14 | (2010.01) | |
| H01L 33/06 | (2010.01) | |
| H01L 27/15 | (2006.01) | |
| H01L 33/32 | (2010.01) | |
| H01L 33/02 | (2010.01) | |
| H01L 33/30 | (2010.01) | |

(52) U.S. Cl.
CPC .............. *H01L 33/14* (2013.01); *H01L 27/15* (2013.01); *H01L 33/025* (2013.01); *H01L 33/06* (2013.01); *H01L 33/305* (2013.01); *H01L 33/32* (2013.01)

(58) Field of Classification Search
CPC ..... H01L 33/14; H01L 33/305; H01L 33/025; H01L 27/15; H01L 33/06; H01L 33/32
See application file for complete search history.

(56) References Cited

U.S. PATENT DOCUMENTS

| | | | | |
|---|---|---|---|---|
| 5,020,068 A | * | 5/1991 | Isshiki ................... | B82Y 20/00 372/45.01 |
| 5,789,773 A | * | 8/1998 | Takeoka ................. | B82Y 20/00 257/101 |
| 6,372,608 B1 | | 4/2002 | Shimoda et al. | |

(Continued)

*Primary Examiner* — Victor A Mandala
(74) *Attorney, Agent, or Firm* — Harness, Dickey & Pierce, P.L.C.

(57) ABSTRACT

A semiconductor light-emitting device includes a first conductive semiconductor layer on a substrate, a superlattice layer including a plurality of first quantum barrier layers and a plurality of first quantum well layers, the plurality of first quantum barrier layers and the plurality of first quantum well layers being alternately stacked on the first conductive semiconductor layer, an active layer on the superlattice layer, and a second conductive semiconductor layer on the active layer, wherein a Si doping concentration of at least one of the plurality of first quantum well layers is equal to or greater than $1.0 \times 10^{16}/cm^3$ and less than or equal to $1.0 \times 10^{18}/cm^3$. Thus, the semiconductor light-emitting device may have increased light output and reliability.

20 Claims, 9 Drawing Sheets

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,339,195 B2 | 3/2008 | Goto et al. |
| 7,365,369 B2 | 4/2008 | Nakamura et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,947,994 B2 | 5/2011 | Tanizawa et al. |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,053,756 B2 | 11/2011 | Nakahara et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,669,585 B1 * | 3/2014 | Chen ................ H01L 33/06 257/101 |
| 8,735,931 B2 | 5/2014 | Han et al. |
| 8,766,295 B2 | 7/2014 | Kim |
| 8,969,849 B2 | 3/2015 | Lee |
| 9,112,083 B2 * | 8/2015 | Emerson ............ H01L 21/0237 |
| 9,343,619 B2 | 5/2016 | Okuno |
| 9,570,657 B2 * | 2/2017 | Chen ................ H01L 33/06 |
| 9,653,642 B1 * | 5/2017 | Raring ............... H01L 33/0075 |
| 9,716,210 B2 * | 7/2017 | Kim .................... H01L 33/007 |
| 2009/0086170 A1 * | 4/2009 | El-Ghoroury ......... B82Y 20/00 353/38 |
| 2009/0302308 A1 * | 12/2009 | Chua ................... B82Y 20/00 257/13 |
| 2013/0207078 A1 | 8/2013 | Laboutin et al. |
| 2015/0263224 A1 * | 9/2015 | Zhang .................. H01L 33/007 257/13 |

\* cited by examiner

SEMICONDUCTOR LIGHT-EMITTING DEVICE

CROSS-REFERENCE TO RELATED APPLICATION

This application claims the benefit of priority from Korean Patent Application No. 10-2017-0002064, filed on Jan. 5, 2017, in the Korean Intellectual Property Office, the disclosure of which is incorporated herein in its entirety by reference.

BACKGROUND

The inventive concepts relate to a semiconductor light-emitting device, and/or to a semiconductor light-emitting device with increased reliability and light output.

Semiconductor light-emitting devices may generate light of a particular wavelength band through recombination of electrons and holes. Such semiconductor light-emitting devices have many advantages, such as long lifespan, low power consumption, and improved early driving characteristics, compared to a light source including a filament, and thus, demand for semiconductor light-emitting devices has been growing. Semiconductor light-emitting devices are used as illumination devices, backlight devices for large liquid crystal displays (LCDs), and the like. Especially, Group III nitride semiconductors are widely used. In recent years, various methods for increasing the light output and reliability of semiconductor light-emitting devices have been developed.

SUMMARY

The inventive concepts provide a semiconductor light-emitting device with increased reliability.

The inventive concepts provide a semiconductor light-emitting device with increased light output.

According to an example embodiment of the inventive concepts, a semiconductor light-emitting device includes a first conductive semiconductor layer on a substrate, a superlattice layer including a plurality of first quantum barrier layers and a plurality of first quantum well layers, the plurality of first quantum barrier layers and the plurality of first quantum well layers being stacked, for example alternately stacked on the first conductive semiconductor layer, an active layer on the superlattice layer, and a second conductive semiconductor layer on the active layer, wherein a Si doping concentration of at least one of the plurality of first quantum well layers is equal to or greater than $5.0 \times 10^{17}/cm^3$ and less than or equal to $1.0 \times 10^{18}/cm^3$.

According to another example embodiment of the inventive concepts, a semiconductor light-emitting device includes a first conductive semiconductor layer, a superlattice layer including a plurality of first quantum barrier layers and a plurality of first quantum well layers, the plurality of first quantum barrier layers and the plurality of first quantum well layers being stacked, for example alternately stacked on the first conductive semiconductor layer, an active layer on the superlattice layer, and a second conductive semiconductor layer on the active layer, wherein at least one of the plurality of first quantum well layers is doped with Si, and an amplitude of a current that flows through the semiconductor light-emitting device when an inverse voltage equal to greater than 4.5 V and less than or equal to 5.5 V is applied to the semiconductor light-emitting device is less than or equal to 0.01 μA.

In some example embodiments, a semiconductor light-emitting device includes a semiconductor light-emitting device having a first conductive semiconductor layer, a superlattice layer on the first conductive semiconductor layer, the superlattice layer including a plurality of first quantum barrier layers and a plurality of first quantum well layers, at least one of the plurality of first quantum barrier layers being in contact with at least one of the plurality of first quantum well layers, the at least one of the plurality of first quantum well layers being doped to reduce a lattice constant difference between the at least one of the plurality of first quantum well layers and the at least one of the plurality of first quantum well layers. In some example embodiments, a Si doping concentration of the at least one of the plurality of first quantum well layers is equal to or greater than $1.0 \times 10^{16}/cm^3$ and less than or equal to $1.0 \times 10^{18}/cm^3$.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
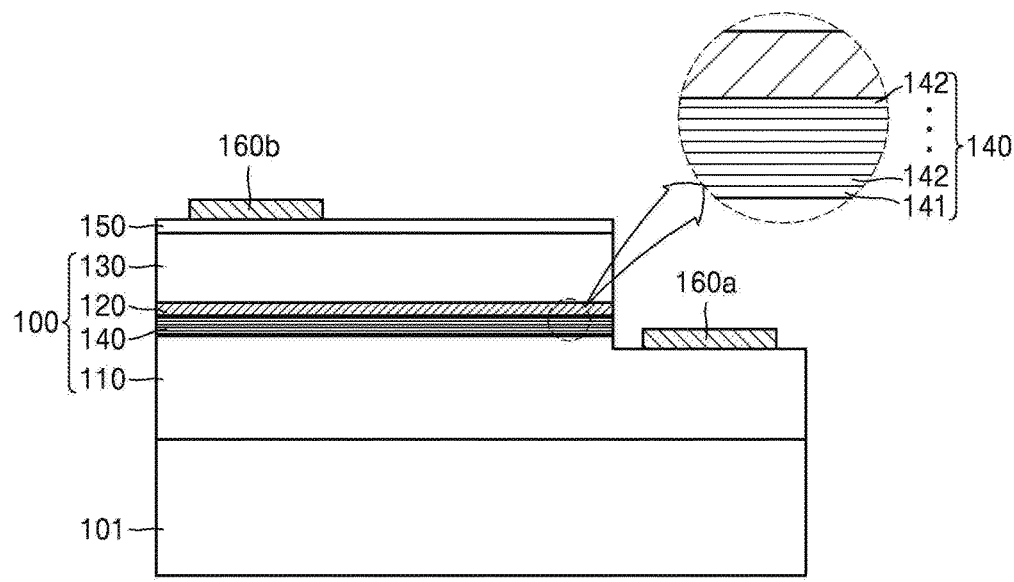
FIG. 1 is a cross-sectional view describing a semiconductor light-emitting device according to example embodiments.

Hereinafter, example embodiments of the inventive concepts will be described in detail with reference to the accompanying drawings. In the drawings, like reference numerals refer to like elements, and repeated descriptions thereof will be omitted.

Figure 2:
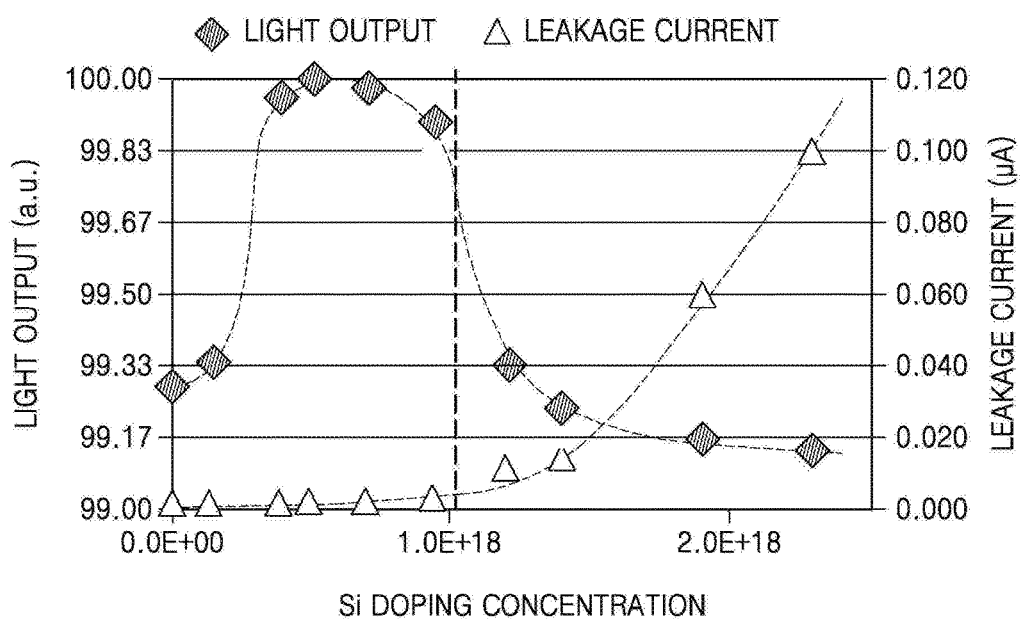
FIG. 2 is a graph describing an effect of a semiconductor light-emitting device according to example embodiments.

FIG. 1 is a cross-sectional view describing a semiconductor light-emitting device 10 according to example embodiments. FIG. 2 is a graph showing a magnitude of light output and a leakage current according to Si doping concentration to describe an effect of the semiconductor light-emitting device 10 according to example embodiments.

Referring to FIG. 1, the semiconductor light-emitting device 10 may include a substrate 101 and a light-emitting structure 100 on the substrate 101. The light-emitting structure 100 may include a first conductive semiconductor layer 110, a superlattice layer 140, an active layer 120, and a second conductive semiconductor layer 130 stacked on the substrate 101 in this stated order.

In the semiconductor light-emitting device 10, the light-emitting structure 100 is mesa etched so that a portion of the first conductive semiconductor layer 110 may be exposed. The semiconductor light-emitting device 10 may include an ohmic contact layer 150 on the second conductive semiconductor layer 130. The semiconductor light-emitting device 10 may include first and second electrodes 160a and 160b on the exposed portion of the first conductive semiconductor layer 110 and a portion of the ohmic contact layer 150, respectively.

The substrate 101 may include an insulating, conductive, or semiconductor material. According to example embodiments, the substrate 101 may include at least one of sapphire, SiC, Si, $MgAl_2O_4$, MgO, $LiAlO_2$, $LiGaO_2$, and GaN.

The substrate 101 is provided as a substrate for semiconductor growth and may include an insulating, conductive, or semiconductor material, such as sapphire, Si, SiC, $MgAl_2O_4$, MgO, $LiAlO_2$, $LiGaO_2$, or GaN.

When the substrate 101 includes Si, the substrate 101 is suitable for manufacture with a large diameter and at a relatively low price, and thus, mass production thereof may increase. When the light-emitting structure 100 is formed on the substrate 101 including silicon, a strong electric field may be formed in the active layer 120 due to tensile stress caused by a difference in lattice constants.

When the substrate 101 includes sapphire, the substrate 101 is a crystal having electrical insulating properties, having hexagonal-rhombo (Hexa-Rhombo R3c) symmetry, having lattice constants of 13.001 Å and 4.758 Å in the c-axis direction and the a-axis direction, respectively, and including a C(0001) plane, an A(1120) plane, and an R (1102) plane. In this case, the C plane is one where it is relatively easy to grow a nitride thin film thereon and is stable at high temperature. When the light-emitting structure 100 is grown along the c-axis, a strong electric field may be formed in the active layer 120 due to a tensile stress caused by a difference in lattice constants.

The substrate 101 may be completely or partially removed to increase light output and/or electrical properties before or after the light-emitting structure 100 is grown. When the substrate 101 includes sapphire, the substrate 101 may be removed by allowing a laser beam to pass through the substrate 101 and be irradiated to an interface between the light-emitting structure 100 and the substrate 101. When the substrate 101 includes silicon or silicon carbide, the substrate 101 may be removed by a method such as polishing/etching.

Light output of the light-emitting structure 100 may be increased by forming a concavo-convex pattern, etc. on one surface or a side of the substrate 101. A size of the concavo-convex pattern may be selected in a range of about 5 nm to about 500 μm. The concavo-convex pattern may be a regular or irregular pattern and may have various shapes such as a column shape, a dome shape, or a hemisphere shape.

Although not illustrated, a buffer layer may be further disposed between the light-emitting structure 100 and the substrate 101. The buffer layer is used to reduce a lattice defect of the light-emitting structure 100 grown on the substrate 101. The buffer layer may be an undoped semiconductor layer including nitride, etc. The buffer layer may reduce a difference between lattice constants of the substrate 101 and the first conductive semiconductor layer 110 including GaN and stacked on the top surface of the substrate 101, thereby increasing crystallinity of the GaN layer. The buffer layer may include undoped GaN, AlN, InGaN, etc. and may be formed by being grown at a low temperature of about 500° C. to about 600° C. to a thickness of dozens to hundreds of Angstroms (Å). In some cases, the buffer layer may include InGaNAlN, $ZrB_2$, $HfB_2$, ZrN, HfN, or TiN.

The term "undoped" means that no impurity doping process is separately performed on a semiconductor layer, and in this case, the semiconductor layer may include an impurity of the original concentration level. For example, when a gallium nitride semiconductor is grown via metalorganic chemical vapor deposition (MOCVD), a dopant, such as Si, may be included therein at a level of about $10^{14}/cm^3$ to about $10^{18}/cm^3$, even though not intended. However, example embodiments are not limited thereto, and the buffer layer may be omitted.

According to example embodiments, the first conductive semiconductor layer 110 may include a single-crystal nitride having a composition of $Al_xIn_yGa_{1-x-y}N$ ($0 \le x \le 1$, $0 \le y \le 1$, $0 \le x+y \le 1$). The first conductive semiconductor layer 110 may include a semiconductor doped with an n-type impurity. According to example embodiments, the first conductive semiconductor layer 110 may include GaN doped with Si.

The first conductive semiconductor layer 110 may be provided as a contact layer and may include an impurity of a relatively high concentration to decrease contact resistance. According to example embodiments, the first conductive semiconductor layer 110 may have an n-type impurity concentration of about $2 \times 10^{18}/cm^3$ or greater. However, example embodiments are not limited thereto.

Although the first conductive semiconductor layer 110 may have a structure including a single layer of the same composition, the first conductive semiconductor layer 110 may have, if necessary, a structure including a plurality of layers with different compositions or thicknesses. According to example embodiments, the first conductive semiconductor layer 110 may further include an electron injection layer capable of increasing electron injection efficiency.

The active layer 120 may be disposed above the first conductive semiconductor layer 110. The active layer 120 may emit light having a predetermined energy as electrons and holes recombine. According to example embodiments, the active layer 120 may include a multiple quantum well (MQW) structure in which quantum well layers (not shown) and quantum barrier layers (not shown) are stacked, for example alternately stacked. In this regard, each of, or at least one of, the quantum well layers and the quantum barrier layers may have a thickness of about 3 nm to 10 nm. According to example embodiments, the MQW structure may be an InGaN/GaN structure. However, example embodiments are not limited thereto, and according to example embodiments, the active layer 120 may have a single quantum well (SQW) structure.

In this regard, due to a difference in lattice constants of the quantum barrier layers including GaN and the quantum well layers including InGaN, the quantum well layers may be subject to a compressive stress. Since a lattice constant of InGaN is greater than the lattice constant of GaN, compressive stress caused by stacking, for example alternately stacking InGaN and GaN may occur. A lattice structure of the active layer 120 is deformed by the compressive stress, and thus, a defect and/or a strong internal electric field may arise. The defect and/or the internal electric field may degrade efficiency of a light-emitting device. The internal electric field of the active layer 120 may cause a potential in an opposite direction to a built-in potential due to PIN junction to quantum wells included in a depletion region DPR shown in FIGS. 3 and 4.

The superlattice layer 140 may be disposed between the first conductive semiconductor layer 110 and the active layer 120. The superlattice layer 140 may include a plurality of first quantum well layers 141 and a plurality of first quantum barrier layers 142 that are stacked, for example alternately stacked on each other. The plurality of first quantum well layers 141 may be thinner than the plurality of first quantum barrier layers 142. According to example embodiments, a thickness of the first quantum well layers 141 may be about 0.5 nm to about 2 nm, and a thickness of the first quantum barrier layers 142 may be about 0.5 nm to about 10 nm. However, example embodiments are not limited thereto.

The first quantum well layers 141 may include InGaN, and the first quantum barrier layers 142 may include GaN. According to example embodiments, the first quantum well layers 141 may be doped with Si. However, example embodiments are not limited thereto, and some of the first quantum well layers 141 may be doped with Si, whereas the others may not be doped with Si. The first quantum barrier layers 142 may not be doped with Si.

According to example embodiments, the superlattice layer 140 may increase uniformity of current by spreading electrons injected from the first electrode 160a, which will be described later, in a horizontal direction. Further, the superlattice layer 140 may reduce an internal electric field caused by a compressive stress acting on the quantum well layers included in the active layer 120.

The electron spreading effect may be improved by increasing a composition of In with respect to the first quantum well layers 141 of the superlattice layer 140. However, when the composition of In exceeds a predetermined value in the first quantum well layers 141, the superlattice layer 140 may have a defect due to a difference in lattice constants of the first quantum well layers 141 including InGaN and the first quantum barrier layers 142 including GaN. The defect of the superlattice layer 140 may be transferred via growth of the superlattice layer 140 and/or the active layer 120 to cause a defect in the active layer 120. The defect of the active layer 120 may degrade the light output of the entire semiconductor light-emitting device 10.

In this regard, Si has a smaller atom radius than Ga, and accordingly, when the first quantum well layers 141 are doped with Si, the difference in lattice constants of the first quantum well layers 141 and the first quantum barrier layers 142 may be reduced. As described above, since a lattice constant of InGaN constituting the first quantum well layers 141 is greater than the lattice constant of GaN constituting the first quantum barrier layers 142, the difference in lattice constants may be reduced by doping the first quantum well layers 141 including InGaN with Si having a small atom radius. Accordingly, defects that occur between the first quantum well layers 141 and the first quantum barrier layers 142 may decrease, and thus, light output may increase. However, when the first quantum well layers 141 are excessively doped with Si, defects may be caused in the first quantum well layers 141 and/or the active layer 120, and thus, device characteristics may be degraded.

Figure 5:
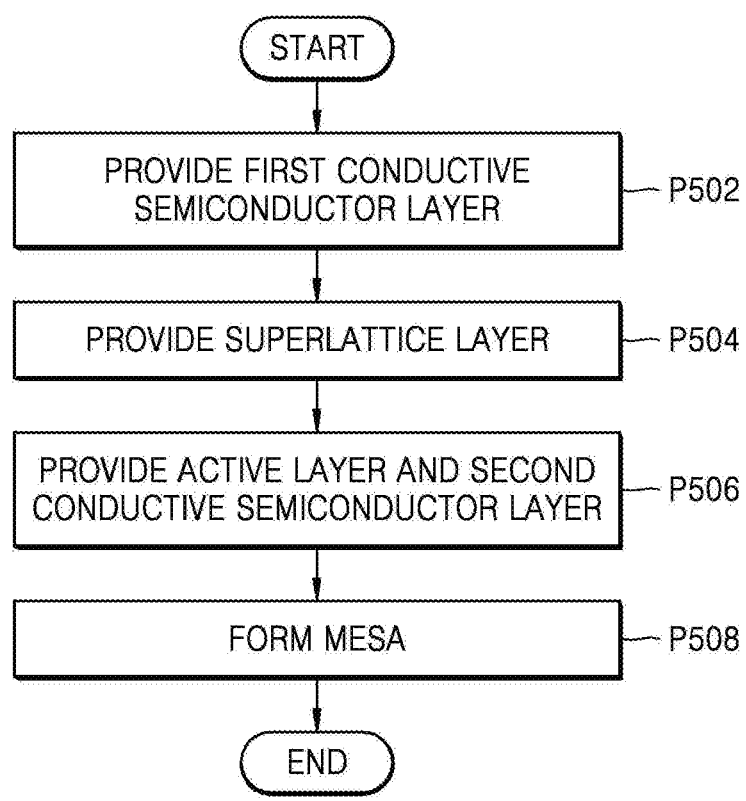
FIG. 5 is a flowchart of a method of manufacturing a semiconductor light-emitting device according to example embodiments.

FIG. 5 is a flowchart of a method of manufacturing a semiconductor light-emitting device according to example embodiments. The experimental results presented in Table 1 have been obtained in the case of the semiconductor light-emitting device manufactured by the method of FIG. 5.

FIGS. 6A to 6D are cross-sectional views describing a method of manufacturing a semiconductor light-emitting device according to example embodiments. The experimental results presented in Table 1 have been obtained in the case of the semiconductor light-emitting device manufactured by the method of FIGS. 6A to 6D.

Figure 6A:
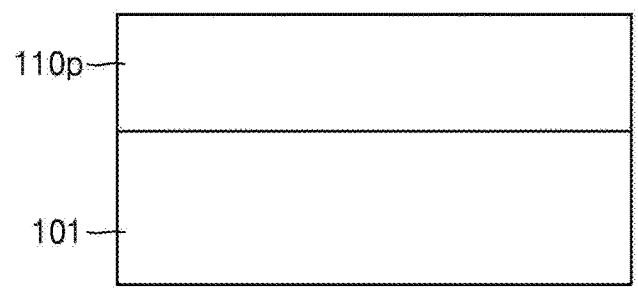
FIGS. 6A to 6D are cross-sectional views describing a method of manufacturing a semiconductor light-emitting device according to example embodiments.

Referring to FIGS. 5 and 6A, in process P502, a first conductive semiconductor material layer 110p may be formed on the substrate 101. According to example embodiments, a concavo-convex pattern, etc. may be formed on the top surface of the substrate 101, but example embodiments are not limited thereto. The substrate 101 may be a substrate including a material such as sapphire, Si, SiC, $MgAl_2O_4$, MgO, $LiAlO_2$, $LiGaO_2$, or GaN.

The first conductive semiconductor material layer 110p may be fabricated using a method such as MOCVD, hydride vapor phase epitaxy (HVPE), or molecular beam epitaxy (MBE). The first conductive semiconductor material layer 110p may include substantially the same composition as the first conductive semiconductor layer 110 described with reference to FIG. 1. In some cases, a buffer layer may be provided between the first conductive semiconductor layer 110 and the substrate 101. The buffer layer may include materials such as undoped GaN, AlN, InGaN, etc.

Figure 6B:
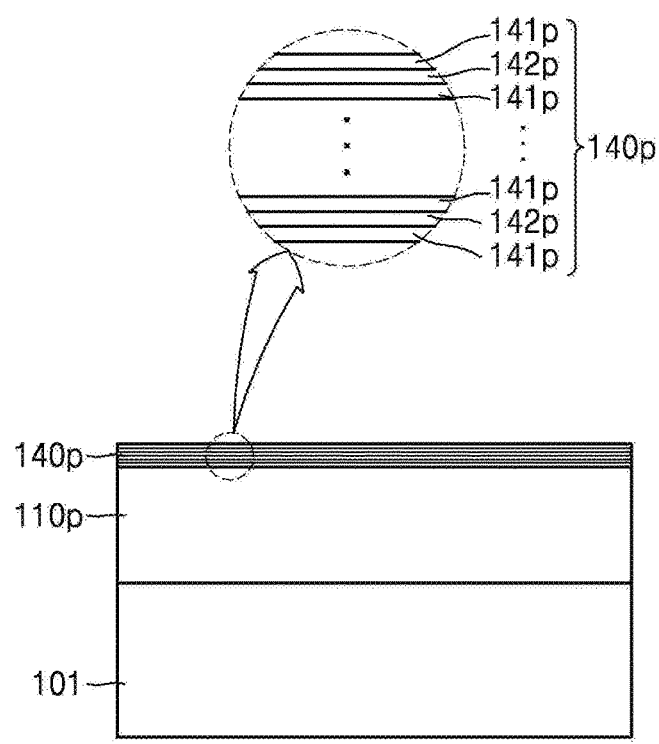

Referring to FIGS. 5 and 6B, in process P504, a superlattice material layer 140p may be provided by forming, for example alternately forming first quantum well material layers 141p and first quantum barrier material layers 142p on the first conductive semiconductor material layer 110p.

The first quantum well material layers 141p may include $In_xGa_{1-x}N$ ($0 \leq x \leq 1$) doped with Si. The first quantum barrier material layers 142p may include GaN. The first quantum well material layers 141p may be formed relatively thinner than the first quantum barrier material layers 142p. According to example embodiments, a thickness of the first quantum well material layers 141p may be about 0.5 nm to about 2 nm, and a thickness of the first quantum barrier material layers 142p may be about 0.5 nm to about 10 nm, but example embodiments are not limited thereto. The superlattice material layer 140p may be provided using a method such as MOCVD or atomic layer deposition (ALD), but example embodiments are not limited thereto.

According to example embodiments, when the superlattice material layer 140p is provided by MOCVD, a metalorganic compound gas such as trimethylgallium, trimethylaluminium, etc. and a nitrogen-containing gas such as ammonia ($NH_3$) may be introduced as reaction gases into a reaction container in which the substrate 101 is installed, and an atmospheric composition ratio of Si to be deposited may be set as a predetermined value.

According to example embodiments, when at least some of the first quantum well material layers 141p are formed, the atmospheric composition ratio of Si may be set so that a Si doping concentration is equal to or greater than about $1.0 \times 10^{16}/cm^3$ and less than or equal to about $1.0 \times 10^{16}/cm^3$. According to example embodiments, when at least some of the first quantum well material layers 141p are formed, the atmospheric composition ratio of Si may be set so that a Si doping concentration is equal to or greater than about $4.0 \times 10^{17}/cm^3$ and less than or equal to about $1.0 \times 10^{18}/cm^3$. According to example embodiments, when at least some of the first quantum well material layers 141p are formed, the atmospheric composition ratio of Si may be set so that a Si doping concentration is equal to or greater than about $1.0×10^{16}$/cm³ and less than or equal to about $9.5×10^{17}$/cm³. According to example embodiments, when at least some of the first quantum well material layers 141p are formed, the atmospheric composition ratio of Si may be set so that a Si doping concentration is equal to or greater than about $4.0×10^{17}$/cm³ and less than or equal to about $9.5×10^{17}$/cm³.

According to example embodiments, when each of, or at least one of, the first quantum well material layers 141p is formed, the atmospheric composition ratio of Si may be set so that a Si doping concentration is equal to or greater than about $1.0×10^{16}$/cm³ and less than or equal to about $1.0×10^{18}$/cm³. According to example embodiments, when each of, or at least one of, the first quantum well material layers 141p is formed, the atmospheric composition ratio of Si may be set so that a Si doping concentration is equal to or greater than about $4.0×10^{17}$/cm³ and less than or equal to about $1.0×10^{18}$/cm³. According to example embodiments, when each of, or at least one of, the first quantum well material layers 141p is formed, the atmospheric composition ratio of Si may be set so that a Si doping concentration is equal to or greater than about $1.0×10^{16}$/cm³ and less than or equal to about $9.5×10^{17}$/cm³. According to example embodiments, when each of, or at least one of, the first quantum well material layers 141p is formed, the atmospheric composition ratio of Si may be set so that a Si doping concentration is equal to or greater than about $4.0×10^{17}$/cm³ and less than or equal to about $9.5×10^{17}$/cm³.

Figure 6C:
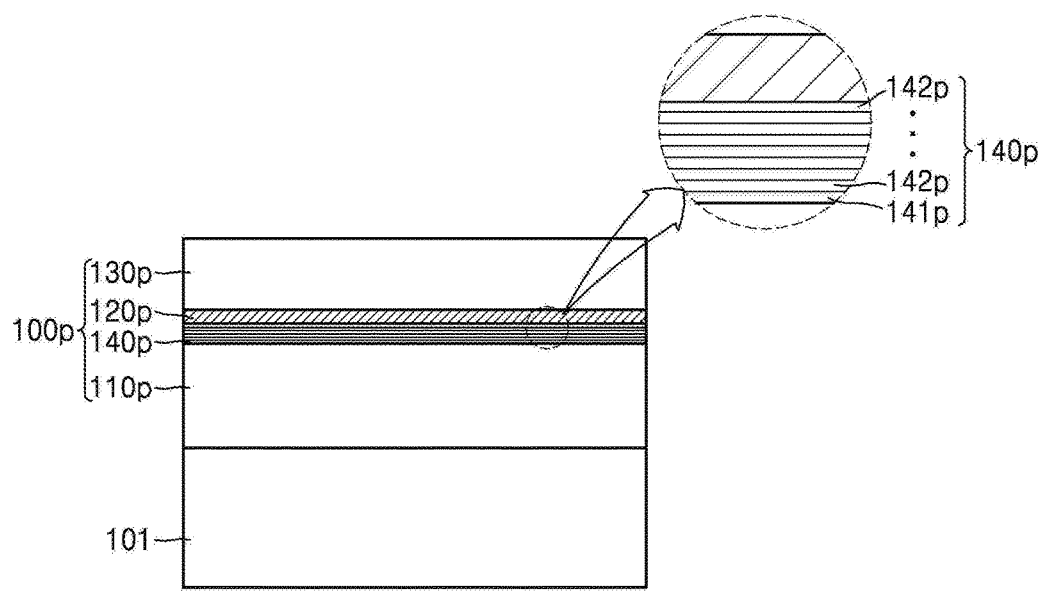

Referring to FIGS. 5 and 6C, in process P506, an active material layer 120p and a second conductive semiconductor material layer 130p may be provided in this stated order on the superlattice material layer 140p. The active material layer 120p and the second conductive semiconductor material layer 130p may be provided by a method such as MOCVD, HVPE, or MBE, but example embodiments are not limited thereto.

According to example embodiments, the first conductive semiconductor material layer 110p and the second conductive semiconductor material layer 130p may be respectively an n-type semiconductor layer and a p-type semiconductor layer. According to example embodiments, locations of the first conductive semiconductor material layer 110p and the second conductive semiconductor material layer 130p may be switched. For example, the second conductive semiconductor material layer 130p may be disposed between the first conductive semiconductor material layer 110p and the substrate 101. Alternatively, the second conductive semiconductor material layer 130p may be provided, and then, the first conductive semiconductor material layer 110p may be provided.

The active material layer 120p may include a SQW structure or an MQW structure. When the active material layer 120p includes an MQW structure, the active material layer 120p may be formed by repeatedly stacking GaN/InGaN.

The second conductive semiconductor material layer 130p may be a nitride single crystal having a composition of $Al_xIn_yGa_{1-x-y}N$ ($0≤x≤1$, $0≤y≤1$, $0≤x+y≤1$) doped with a p-type impurity. Mg may be used as the p-type impurity.

The first conductive semiconductor material layer 110p, the active material layer 120p, the second conductive semiconductor material layer 130p, and the superlattice material layer 140p may constitute a light-emitting stack 100p.

Figure 6D:
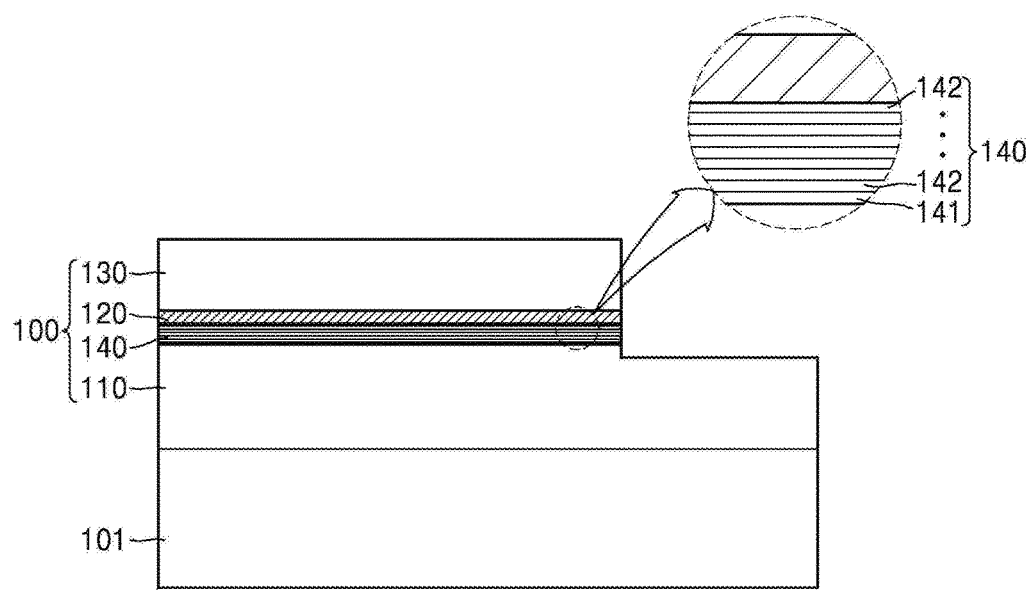

Referring to FIGS. 5 and 6D, in process P508, the light-emitting structure 100 may be formed by dry-etching or wet-etching the light-emitting stack 100p. According to example embodiments, the first conductive semiconductor material layer 110p may be etched to a predetermined depth by excessive etching. However, example embodiments are not limited thereto, and the first conductive semiconductor material layer 110p may not be etched, and only the top surface thereof may be partially exposed. Thus, the first conductive semiconductor layer 110, the active layer 120, the second conductive semiconductor layer 130, and the superlattice layer 140 may be formed.

Table 1 shows light output and leakage current according to Si doping concentration.

TABLE 1

| Si doping concentration (/cm³) | Light output (a.u.) | Leakage current at the time of applying 5 V inverse voltage (μA) |
|---|---|---|
| 0 | 99.3 | 0.003 |
| $1.0 × 10^{16}$ | 99.33 | 0.003 |
| $4.0 × 10^{17}$ | 99.97 | 0.003 |
| $5.0 × 10^{17}$ | 100 | 0.002 |
| $7.0 × 10^{17}$ | 99.97 | 0.003 |
| $9.5 × 10^{17}$ | 99.9 | 0.004 |
| $1.2 × 10^{18}$ | 99.33 | 0.012 |
| $1.4 × 10^{18}$ | 99.23 | 0.015 |
| $1.9 × 10^{18}$ | 99.3 | 0.06 |
| $2.3 × 10^{18}$ | 99.13 | 0.1 |

The values of the light output are obtained by normalization using a light output corresponding to a Si doping concentration of $5.0×10^{17}$/cm³ as 100. The leakage current is a current that flows through the semiconductor light-emitting device when an inverse voltage of 5V is applied to the semiconductor light-emitting device, and a unit of the leakage current is μA.

Referring to FIG. 2 and Table 1, it may be confirmed that the light output rapidly increases in a range where Si doping concentration in the first quantum well layers 141 exceeds $1.0×10^{16}$/cm³. Also, it may be confirmed that, especially when the Si doping concentration in the first quantum well layers 141 is equal to or greater than $4.0×10^{17}$/cm³, the light output has increased significantly.

It may be confirmed that the light output rapidly decreases in a range exceeding $1.0×10^{18}$/cm³. It may be confirmed that, especially when the Si doping concentration in the first quantum well layers 141 is less than or equal to $9.5×10^{17}$/cm³, the light output has increased significantly.

Figure 3:
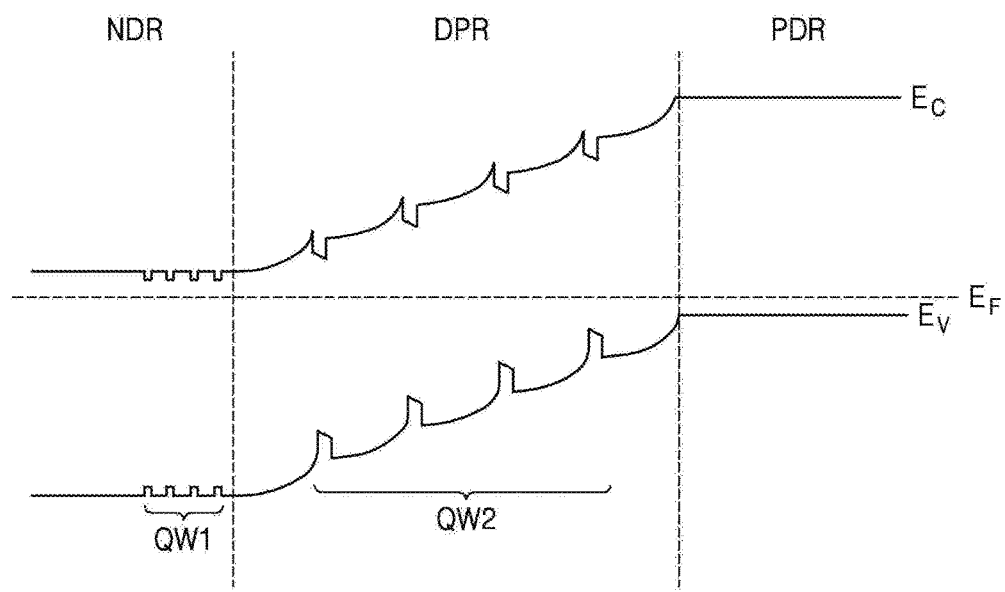
FIGS. 3 and 4 each are an energy diagram describing an effect of a semiconductor light-emitting device according to example embodiments.
Figure 4:
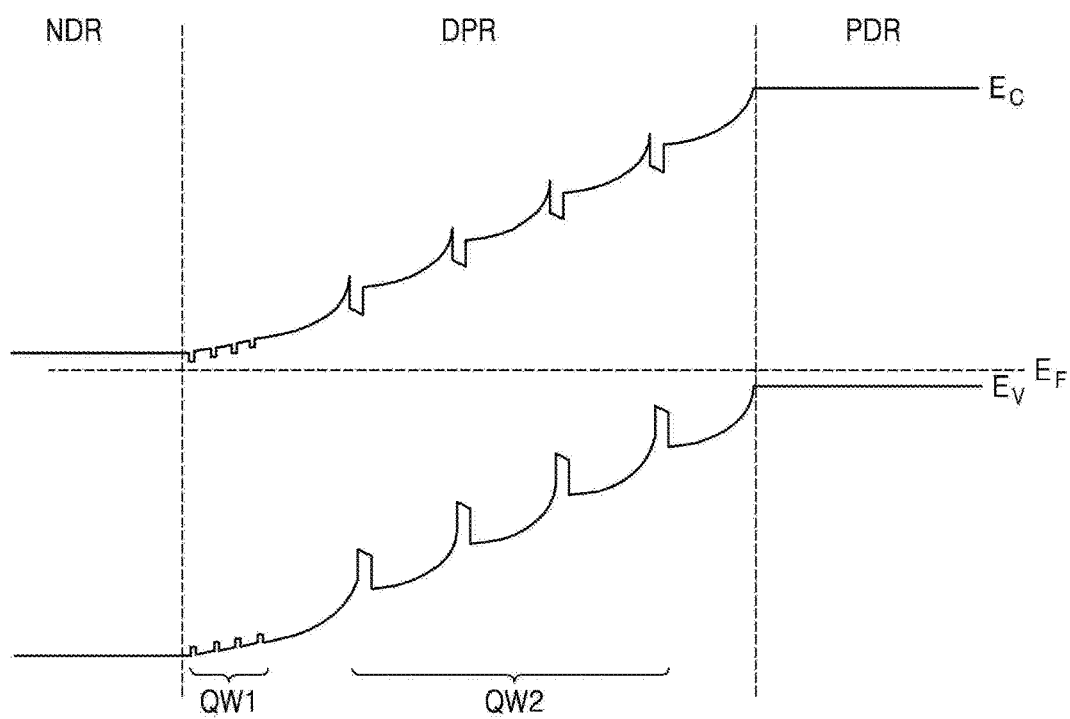

FIG. 3 is an energy band diagram of the semiconductor light-emitting device 10 according to example embodiments. FIG. 4 is an energy band diagram generated at the time of externally applying an inverse voltage with respect to FIG. 3. In this regard, the inverse voltage, which is a voltage that gives a potential in the same direction as a built-in potential, is a voltage in a direction of increasing a band gap of PIN junction.

In each of the energy band diagrams of FIGS. 3 and 4, two solid lines correspond to a valence band $E_V$ and a conduction band $E_C$, and one dashed line corresponds to a Fermi level $E_F$.

The valence band $E_V$ is the highest electronic energy level where electrons normally exist at an absolute zero temperature and may be filled with electrons having continuous energy. Electrons that belong to the valence band $E_V$ are bound to a mother atom and do not move at all. The conduction band $E_C$ is not full with electrons and thus is an energy band where electrons have conductivity.

The Fermi level $E_F$ is a level of upper bounding of energy that electrons have in a material that is in thermal equilibrium. A probability of getting occupied by electrons at this level is 0.5, and electrons rarely exist at a level that has more energy. The Fermi level of an intrinsic semiconductor lies in the middle of an energy gap, the Fermi level of an n-type semiconductor at room temperature lies above a donor level, and the Fermi level of a p-type semiconductor lies below an acceptor level.

When a PIN junction is formed, the Fermi level $E_F$ of a P conductive region PDR and an N conductive region NDR may reach an equilibrium value via a process in which diffusion due to a difference in concentrations of majority carriers and the resultant electric field reach equilibrium. Accordingly, the depletion region DPR may be formed in the active layer 120 as carriers are depleted due to diffusion near a PIN junction plane. Also, an energy band diagram in which energy levels of the valence band $E_V$ and the conduction band $E_C$ of the P conductive region PDR increases, and as shown in FIG. 3, the depletion region DPR faces a substantially right upper direction is formed. A built-in potential may be formed as diffusion of the majority carriers and an electric field by essential charges generated by carrier diffusion reach equilibrium in the depletion region DPR.

Referring to FIG. 3, a first quantum well structure QW1 corresponding to the superlattice layer 140 (refer to FIG. 1) may be formed in the N conductive region NDR adjacent to the depletion region DPR. Also, a second quantum well structure QW2 may be formed in the depletion region DPR. Electrons and holes are confined at predetermined locations of the depletion region DPR by the second quantum well structure QW2 formed in the depletion region DPR, and chances of occurrence of recombination may increase. In this regard, due to the above-described internal electric field caused by a compressive stress, well bottoms of the second quantum well structure QW2 may be inclined in an opposite direction to that of the built-in potential. For example, in FIG. 3, the well bottoms of the second quantum well structure QW2 may face a right lower direction. In this regard, the energy gap refers to a difference in potentials of the conduction band $E_C$ of the N conductive region NDR and the conduction band $E_C$ of the P conductive region PDR, or a difference in potentials of the valence band $E_V$ of the N conductive region NDR and the valence band $E_V$ of the P conductive region PDR.

Referring to FIG. 4, the band gap may be increased by externally applied inverse voltage. Also, the depletion region DPR may be expanded, and thus, the first quantum well structure QW1 may be entirely or partially included in the depletion region DPR. Accordingly, a defect included in the first quantum well structure QW1 may also increase a current (hereinafter, referred to as a leakage current) according to application of an inverse voltage.

Referring to FIG. 1 again, a pressure resistance of a light-emitting diode included in the semiconductor light-emitting device 10 to an inverse voltage may be lower than the pressure resistance of a general silicon-based diode. When an inverse voltage exceeding a pressure resistance range is applied to the semiconductor light-emitting device 10, the semiconductor light-emitting device 10 may be destroyed. In this regard, pressure resistance characteristics of the semiconductor light-emitting device 10 with respect to the inverse voltage are related to a size of the leakage current. For example, when a semiconductor light-emitting device has ideal pressure resistance characteristics, a leakage current may be 0. When the size of the leakage current exceeds a predetermined value (for example, 0.01 μA), device reliability may deteriorate. On the contrary, as the leakage current decreases, pressure resistance characteristics of the semiconductor light-emitting device 10 with respect to the inverse voltage may improve.

When a Si doping concentration of the first quantum well layers 141 exceeds a predetermined value, a defect caused by Si in the superlattice layer 140 may increase a current value under an inverse voltage. When an inverse voltage is applied, some electrons may generate a leakage current via a mechanism referred to as electron hopping, which is caused by defects in the superlattice layer 140. Accordingly, pressure resistance characteristics of the superlattice layer 140 may be degraded, and device reliability may be degraded too. Referring to Table 1 again, when the Si doping concentration of the first quantum well layers 141 is equal to or greater than about $1.0 \times 10^{18}/cm^3$, the leakage current may increase significantly. When the Si doping concentration of the first quantum well layers 141 is less than or equal to about $7.95 \times 10^{17}/cm^3$, device reliability may be increased.

According to example embodiments, a Si doping concentration of at least some of the first quantum well layers 141 may be equal to or greater than about $1.0 \times 10^{16}/cm^3$ and less than or equal to about $1.0 \times 10^{18}/cm^3$. According to example embodiments, a Si doping concentration of at least some of the first quantum well layers 141 may be equal to or greater than about $1.0 \times 10^{16}/cm^3$ and less than or equal to about $9.5 \times 10^{17}/cm^3$. According to example embodiments, a Si doping concentration of at least some of the first quantum well layers 141 may be equal to or greater than about $4.0 \times 10^{17}/cm^3$ and less than or equal to about $1.0 \times 10^{18}/cm^3$. According to example embodiments, a Si doping concentration of at least some of the first quantum well layers 141 may be equal to or greater than about $4.0 \times 10^{17}/cm^3$ and less than or equal to about $9.5 \times 10^{17}/cm^3$.

According to example embodiments, a Si doping concentration of each of, or at least one of, the first quantum well layers 141 may be equal to or greater than about $1.0 \times 10^{16}/cm^3$ and less than or equal to about $1.0 \times 10^{18}/cm^3$. According to example embodiments, a Si doping concentration of each of, or at least one of, the first quantum well layers 141 may be equal to or greater than about $1.0 \times 10^{16}/cm^3$ and less than or equal to about $9.5 \times 10^{17}/cm^3$. According to example embodiments, a Si doping concentration of each of, or at least one of, the first quantum well layers 141 may be equal to or greater than about $4.0 \times 10^{17}/cm^3$ and less than or equal to about $1.0 \times 10^{18}/cm^3$. According to example embodiments, a Si doping concentration of each of, or at least one of, the first quantum well layers 141 may be equal to or greater than about $4.0 \times 10^{17}/cm^3$ and less than or equal to about $9.5 \times 10^{17}/cm^3$.

The second conductive semiconductor layer 130 may be a nitride single crystal having a composition of $Al_xIn_yGa_{1-x-y}N$ (0≤x≤1, 0≤y≤1, 0≤x+y≤1) doped with a p-type impurity. According to example embodiments, the second conductive semiconductor layer 130 may be doped with Zn, Cd, Be, Mg, Ca, Ba, or the like.

The second conductive semiconductor layer 130 may further include a current breaking layer (not shown) in a portion thereof adjacent to the active layer 120. The current breaking layer (not shown) may include a structure in which a plurality of $Al_xIn_yGa_{1-x-y}N$ (0≤x≤1, 0≤y<1, 0≤x+y<1) having different compositions are stacked, or a single layer or multiple layer structure including $Al_zGa_{1-z}N$ (0≤z<1). A band gap of the current breaking layer may be larger than the band gap of a quantum well structure included in the active layer 120. The current breaking layer may hinder or prevent electrons in the active layer 120 from moving to the second conductive semiconductor layer 130.

Although the semiconductor light-emitting device 10 illustrated in FIG. 1 may have a flip-chip structure in which the first and second electrodes 160a and 160b are arranged in an opposite direction to a light extraction surface, the example embodiments are not limited thereto. When the semiconductor light-emitting device 10 has a flip-chip structure, the ohmic contact layer 150 is a highly reflective ohmic contact layer and may include a highly reflective material. For example, the ohmic contact layer 150 may include a single layer or a plurality of layers selected from the group including Ag, Ni, Al, Rh, Pd, Ir, Ru, Mg, Zn, Pt, and Au. Also, the ohmic contact layer 150 may additionally include GaN, InGaN, ZnO or a graphene layer.

The first and second electrodes 160a and 160b may include materials such as Ag, Ni, Al, Rh, Pd, Ir, Ru, Mg, Zn, Pt, and Au. The first and second electrodes 160a and 160b may include a structure of two or more layers, such as Ni/Ag, Zn/Ag, Ni/Al, Zn/Al, Pd/Ag, Pd/Al, Ir/Ag. Ir/Au, Pt/Ag, Pt/Al, or Ni/Ag/Pt.

Figure 7:
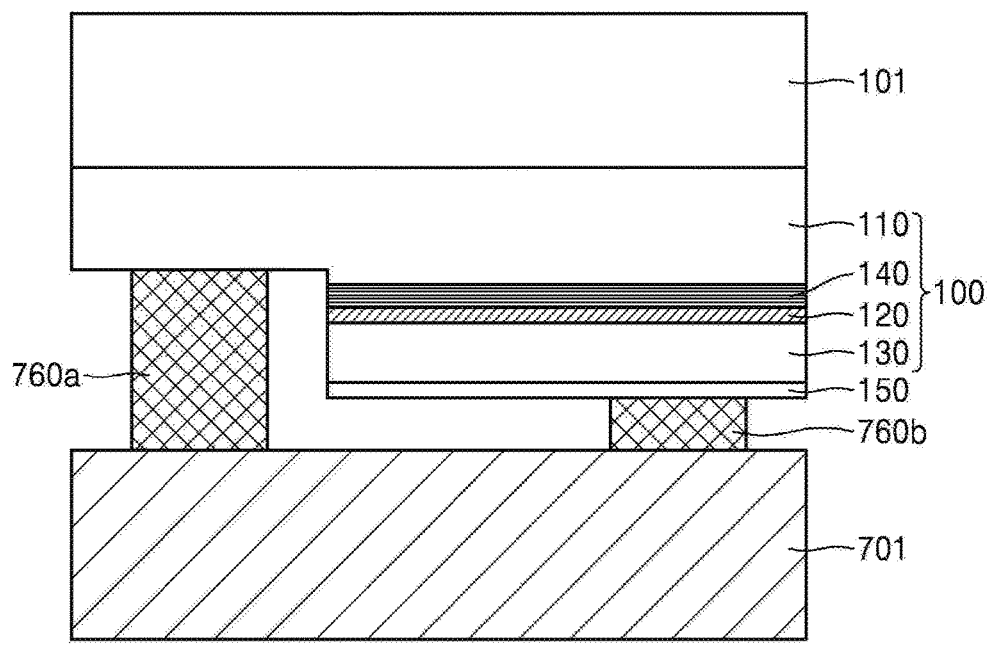
FIG. 7 is a cross-sectional view describing a semiconductor light-emitting device package including a semiconductor light-emitting device according to example embodiments.

FIG. 7 is a cross-sectional view describing a semiconductor light-emitting device package 700 including a semiconductor light-emitting device according to example embodiments.

Referring to FIG. 7, the semiconductor light-emitting device package 700 according to example embodiments may include the light-emitting structure 100 disposed above a package substrate 701. The light-emitting structure 100 may include the first conductive semiconductor layer 110, the second conductive semiconductor layer 130, and the active layer 120 between the first conductive semiconductor layer 110 and the second conductive semiconductor layer 130. The superlattice layer 140 may be disposed between the first conductive semiconductor layer 110 and the active layer 120. The ohmic contact layer 150 may be disposed under the bottom surface of the second conductive semiconductor layer 130.

First and second electrodes 760a and 760b may be respectively disposed under the bottom surfaces of the first conductive semiconductor layer 110 and the ohmic contact layer 150. According to example embodiments, the semiconductor light-emitting device 700 may have a flip-chip structure including the first and second electrodes 760a and 760b that face the package substrate 701.

Figure 8:
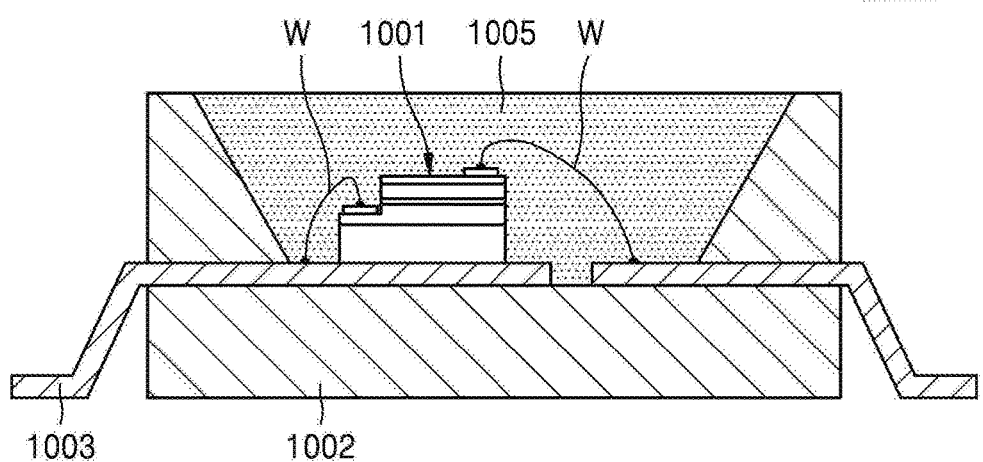
FIGS. 8 and 9 each are a cross-sectional view describing a semiconductor light-emitting device package including a semiconductor light-emitting device according to example embodiments.
Figure 9:
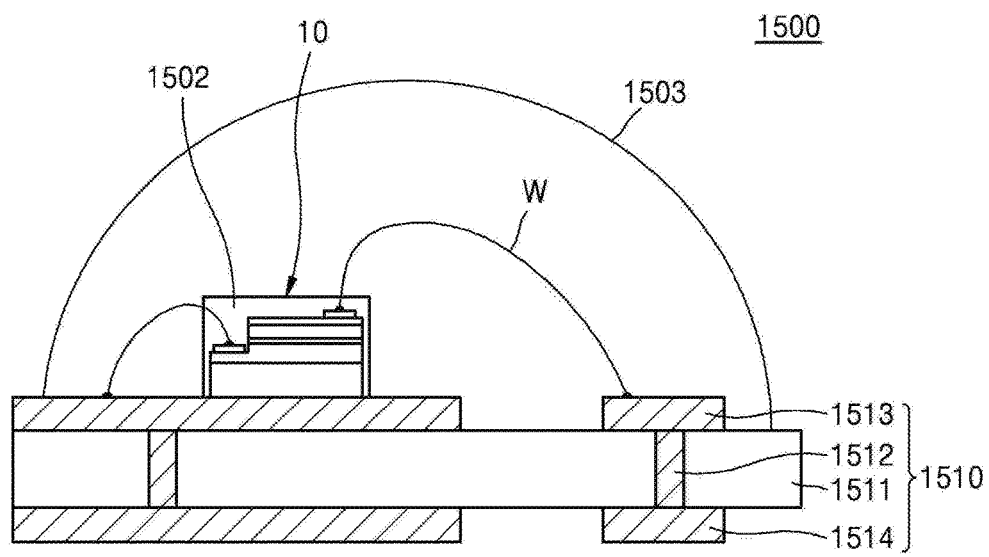

FIGS. 8 and 9 each are a cross-sectional view describing a semiconductor light-emitting device package including a semiconductor light-emitting device according to example embodiments.

Referring to FIG. 8, a semiconductor light-emitting device package 1000 may include a semiconductor light-emitting device 1001, a package body 1002, and a pair of lead frames 1003. The semiconductor light-emitting device 1001 may be mounted on the lead frames 1003 and be electrically connected to the lead frames 1003 via conductive wires W. In some example embodiments, the semiconductor light-emitting device 1001 may be mounted on a region other than the lead frames 1003, for example, on the package body 1002. The package body 1002 may include a cup shape to increase reflection efficiency of light. The reflection cup may include an encapsulation material 1005 including a light-transmitting material to encapsulate the semiconductor light-emitting device 1001, the conductive wires W, and the like.

Referring to FIG. 9, a semiconductor light-emitting device package 1500 may include the semiconductor light-emitting device 10, a mounting substrate 1510, and an encapsulation material 1503. Also, a wavelength converter 1502 may be formed on a surface and sides of the semiconductor light-emitting device 10. The semiconductor light-emitting device 10 may be mounted on the mounting substrate 1510 and be electrically connected to the mounting substrate 1510 via the conductive wires W, the substrate 101 (refer to FIG. 1), or the like.

The mounting substrate 1510 may include a substrate body 1511, an upper surface electrode 1513, and a lower surface electrode 1514. Also, the mounting substrate 1510 may include a through electrode 1512 connecting the upper surface electrode 1513 and the lower surface electrode 1514 to each other. The mounting substrate 1510 may be a printed circuit board (PCB), a metal-core PCB, a metal PCB, a flexible PCB, or the like. A structure of the mounting substrate 1510 is not limited to that shown in FIG. 9 and may have various forms.

The wavelength converter 1502 may include a fluorescent substance or quantum dots. According to example embodiments, the encapsulation material 1503 may be formed of or including a lens structure having a dome shape with a convex upper surface. In some example embodiments, an upper surface of the encapsulation material 1503 may have a convex or concave lens structure. Accordingly, an orientation angle of light emitted via the upper surface of the encapsulation material 1503 may be adjusted.

Figure 10:
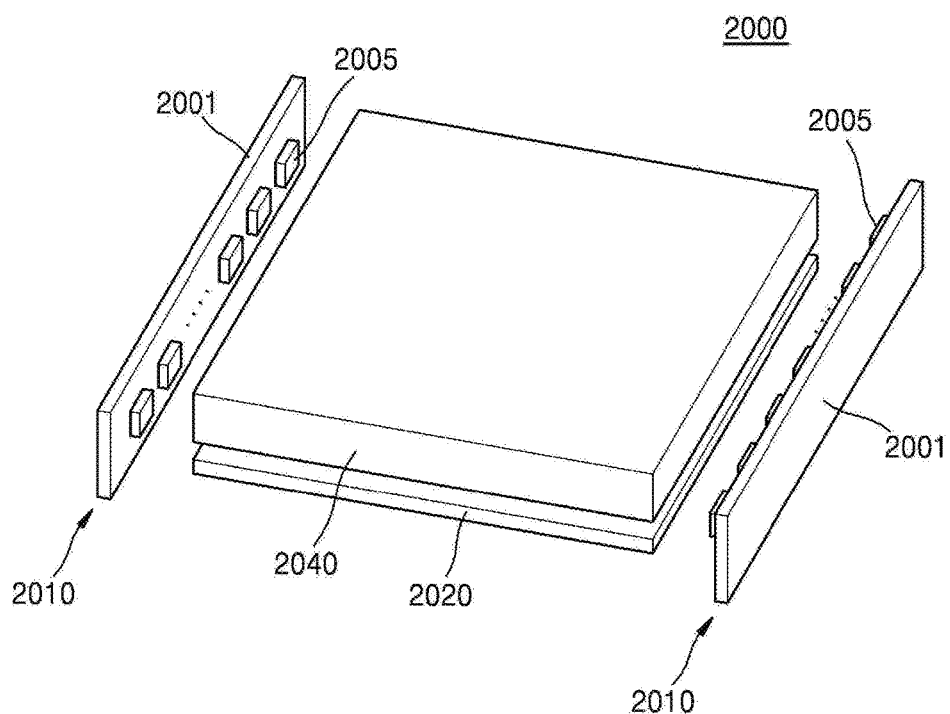
FIG. 10 is a perspective view describing a backlight unit including a semiconductor light-emitting device according to an example embodiment.

FIG. 10 is a perspective view describing a backlight unit including a semiconductor light-emitting device according to example embodiments.

Specifically, a backlight unit 2000 may include a waveguide 2040 and light source modules 2010 provided on both sides of the waveguide 2040. The backlight unit 2000 may further include a reflective plate 2020 disposed below the waveguide 2040. The backlight unit 2000 according to example embodiment may be an edge-type backlight unit. According to example embodiments, the light source module 2010 may be provided only on one side of the waveguide 2040 or may be additionally provided on another side. The light source module 2010 may include a printed circuit board 2001 and a plurality of light sources 2005 mounted on the top surface of the printed circuit board 2001. The light source 2005 may include the semiconductor light-emitting device 10 according to the above example embodiments (refer to FIG. 1).

Figure 11:
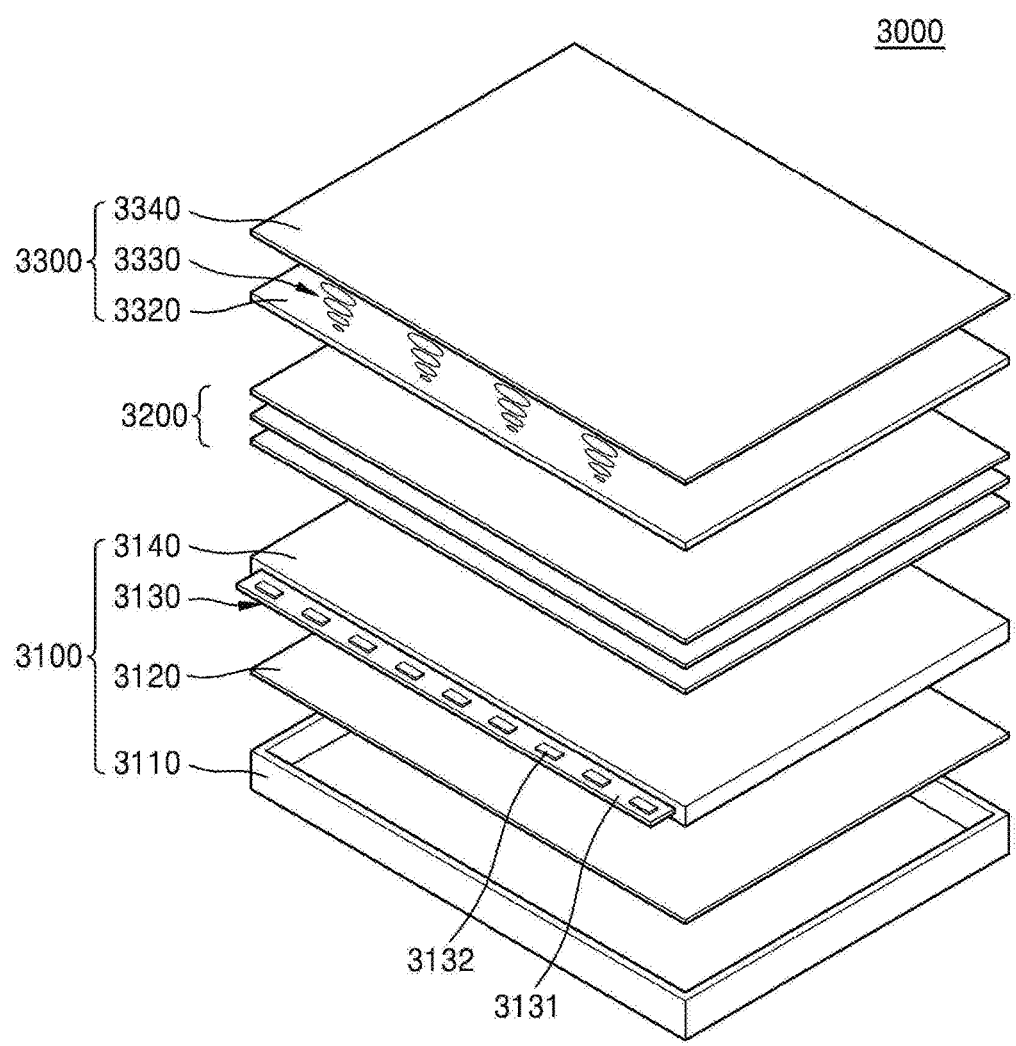
FIG. 11 is an exploded perspective view describing a display including a semiconductor light-emitting device according to an example embodiment.

FIG. 11 is an exploded perspective view describing a display including a semiconductor light-emitting device according to example embodiments.

Specifically, a display 3000 may include a backlight unit 3100, an optical sheet 3200, and an image display panel 3300, such as a liquid crystal panel. The backlight unit 3100 may include a bottom case 3110, a reflective plate 3120, a waveguide 3140, and a light source module 3130 provided on at least one side of the waveguide 3140. The light source module 3130 may include a printed circuit board 3131 and a light source 3132.

The light source 3132 may be a side-view type semiconductor light-emitting device mounted on a side surface adjacent to a light-emitting surface. The light source 3132 may be the semiconductor light-emitting device 10 according to the above example embodiments (refer to FIG. 1). The optical sheet 3200 may include various types of sheets, such as a sheet, a prism sheet, or a protective sheet.

The image display panel 3300 may display an image by using light emitted from the optical sheet 3200. The image display panel 3300 may include an array substrate 3320, a liquid crystal layer 3330, and a color filter substrate 3340. The array substrate 3320 may include pixel electrodes arranged in a matrix form, thin-film transistors for applying driving voltage to the pixel electrodes, and signal lines for operating the thin film transistors.

The color filter substrate 3340 may include a transparent substrate, a color filter, and a common electrode. The color filter may include filters for selectively transmitting light of a specific wavelength from among white light emitted from the backlight unit 3100. The liquid crystal layer 3330 may be rearranged according to an electric field formed between the pixel electrode and a common electrode and may control light transmittance. Light with adjusted light transmittance may display an image by passing through the color filter of the color filter substrate 3340. The image display panel 3300 may further include a driving circuit unit for processing image signals.

Figure 12:
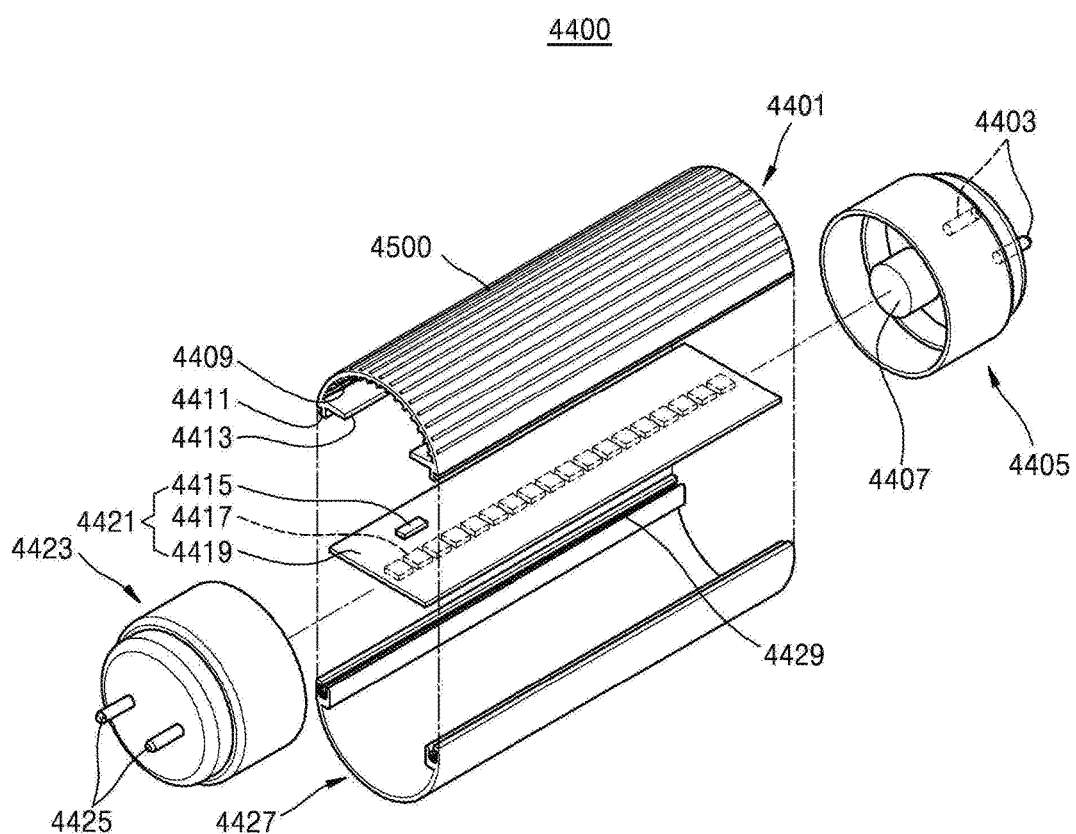
FIG. 12 is an exploded perspective view describing a bar-type illumination device including a semiconductor light-emitting device according to an example embodiment.

FIG. 12 is an exploded perspective view describing a bar-type illumination device including a semiconductor light-emitting device according to example embodiments.

Specifically, an illumination device 4400 may include a heat dissipating member 4401, a cover 4427, a light source module 4421, a first socket 4405, and a second socket 4423. A plurality of heat dissipating fins 4500 and 4409 may be disposed on an inner surface and/or an outer surface of the heat dissipating member 4401 in a concavo-convex shape. The heat dissipating fins 4500 and 4409 may be designed to have various shapes and intervals. A protruding support base 4413 is disposed on an inner side of the heat dissipating member 4401. The light source module 4421 may be fixed to the support base 4413. Stopping hooks 4411 may be formed at both ends of the heat dissipating member 4401.

Stopping grooves 4429 are formed in the cover 4427 and the stopping hooks 4411 of the heat dissipating member 4401 may be coupled to the stopping grooves 4429 in a hook-coupling structure. The locations where the stopping grooves 4429 and the stopping hooks 4411 are formed may be reversed.

The light source module 4421 may include a semiconductor light-emitting device array including semiconductor light-emitting devices. The light source module 4421 may include a printed circuit board 4419, a light source 4417, and a controller 4415. The controller 4415 may store driving information regarding the light source 4417. The printed circuit board 4419 may include circuit wires for operating the light source 4417. In addition, the printed circuit board 4419 may include components for operating the light source 4417. The light source 4417 may be a semiconductor light-emitting device 10 according to the above embodiments (refer to FIG. 1).

The first and second sockets 4405 and 4423, which are a pair of sockets, are coupled to respective ends of a cylindrical cover unit including the heat dissipating member 4401 and the cover 4427. For example, the first socket 4405 may include an electrode terminal 4403 and a power supply 4407, and a dummy terminal 4425 may be disposed in the second socket 4423. Also, an optical sensor and/or a communication module may be embedded in either of the first socket 4405 or the second socket 4423. For example, an optical sensor and/or a communication module may be embedded in the second socket 4423 where the dummy terminal 4425 is disposed. In another example embodiment, an optical sensor and/or a communication module may be embedded in the first socket 4405 in which the electrode terminal 4403 is disposed.

While the inventive concepts have been particularly shown and described with reference to the example embodiments thereof, it will be understood that various changes in form and details may be made therein without departing from the spirit and scope of the following claims.

What is claimed is:

1. A semiconductor light-emitting device comprising: a first conductive semiconductor layer; a superlattice layer including a plurality of first quantum barrier layers and a plurality of first quantum well layers, the plurality of first quantum barrier layers and the plurality of first quantum well layers being stacked on the first conductive semiconductor layer; an active layer on the superlattice layer; and a second conductive semiconductor layer on the active layer and in direct contact with the active layer, a Si doping concentration of at least one of the plurality of first quantum well layers being equal to or greater than $1.0 \times 10^{16}/cm^3$ and less than or equal to $1.0 \times 10^{18}/cm^3$.

2. The device of claim 1, wherein the Si doping concentration of the at least one of the plurality of first quantum well layers is equal to or greater than $4.0 \times 10^{17}/cm^3$.

3. The device of claim 1, wherein the Si doping concentration of the at least one of the plurality of first quantum well layers is less than or equal to $9.5 \times 10^{17}/cm^3$.

4. The device of claim 1, wherein a thickness of at least one of the plurality of first quantum well layers is equal to or greater than 0.5 nm and less than or equal to 2 nm.

5. The device of claim 1, wherein a thickness of at least one of the plurality of first quantum barrier layers is equal to or greater than 0.5 nm and less than or equal to 10 nm.

6. The device of claim 1, wherein the active layer comprises a multiple quantum well structure.

7. The device of claim 1, wherein:
the active layer includes a plurality of second quantum well layers and a plurality of second quantum barrier layers,
the plurality of second quantum well layers and the plurality of second quantum barrier layers are stacked on one other,
at least one of the plurality of second quantum well layers includes InGaN, and
at least one of the plurality of second quantum barrier layers includes GaN.

8. The device of claim 7, wherein a thickness of at least one of the plurality of second quantum well layers and a thickness of at least one of the plurality of second quantum barrier layers is equal to or greater than 3 nm and less than or equal to 10 nm.

9. The device of claim 1, further comprising:
a substrate under the first conductive semiconductor layer, the substrate having hexagonal-rhombo symmetry, and a top surface of the substrate being a C(0001) plane.

10. The device of claim 9, further comprising:
a buffer layer between the superlattice layer and the substrate.

11. The device of claim 1, wherein the plurality of first quantum barrier layers and the plurality of first quantum well layers are alternately stacked on the first conductive semiconductor layer.

12. A semiconductor light-emitting device comprising:
a first conductive semiconductor layer;
a superlattice layer including a plurality of first quantum barrier layers and a plurality of first quantum well layers, the plurality of first quantum barrier layers and the plurality of first quantum well layers being stacked on the first conductive semiconductor layer;
an active layer on the superlattice layer; and
a second conductive semiconductor layer on the active layer,
at least one of the plurality of first quantum well layers being doped with Si, and
an amplitude of a current flowing through the semiconductor light-emitting device when an inverse voltage equal to greater than 4.5 V and less than or equal to 5.5 V is applied to the semiconductor light-emitting device being less than or equal to 0.01 µA.

13. The device of claim 12, wherein a Si doping concentration of the at least one of the plurality of first quantum well layers is equal to or greater than $1.0 \times 10^{16}/cm^3$ and less than or equal to $1.0 \times 10^{18}/cm^3$.

14. The device of claim 13, wherein the Si doping concentration of the at least one of the plurality of first quantum well layers is equal to or greater than $4.0 \times 10^{17}/cm^3$.

15. The device of claim 13, wherein the Si doping concentration of the at least one of the plurality of first quantum well layers is less than or equal to $9.5 \times 10^{17}/cm^3$.

16. The device of claim 12, wherein a thickness of the plurality of first quantum well layers is equal to or greater than 0.5 nm and less than or equal to 2 nm.

17. The device of claim 12, wherein the plurality of first quantum barrier layers and the plurality of first quantum well layers are alternately stacked on the first conductive semiconductor layer.

18. A semiconductor light-emitting device comprising:
a first conductive semiconductor layer; and
a superlattice layer on the first conductive semiconductor layer, the superlattice layer including a plurality of first quantum barrier layers and a plurality of first quantum well layers, at least one of the plurality of first quantum barrier layers being in contact with at least one of the plurality of first quantum well layers;
the at least one of the plurality of first quantum well layers being doped with Si such that a lattice constant difference between the at least one of the plurality of first quantum barrier layers and the at least one of the plurality of first quantum well layers is less than the lattice constant difference when the at least one of the plurality of first quantum well layers is not doped with Si;
a doping concentration of the Si in the at least one of the plurality of first quantum well layers being equal to or greater than $1.0 \times 10^{16}/cm^3$ and less than or equal to $1.0 \times 10^{18}/cm^3$.

19. The semiconductor light-emitting device of claim 18, wherein the plurality of first quantum barrier layers and the plurality of first quantum well layers are alternately stacked on the first conductive semiconductor layer.

20. The semiconductor light-emitting device of claim 18, further comprising:
an active layer on the superlattice layer; and
a second conductive semiconductor layer on the active layer.

* * * * *